(12) United States Patent
Nagano et al.

(10) Patent No.: US 10,727,333 B2
(45) Date of Patent: Jul. 28, 2020

(54) SEMICONDUCTOR DEVICE INCLUDING LATERALLY DIFFUSED METAL-OXIDE-SEMICONDUCTOR FIELD EFFECT TRANSISTOR AND METHOD FOR MANUFACTURING THE SAME

(71) Applicant: KABUSHIKI KAISHA TOSHIBA, Tokyo (JP)

(72) Inventors: Hirofumi Nagano, Fujisawa Kanagawa (JP); Koichi Ozaki, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 171 days.

(21) Appl. No.: 15/407,371

(22) Filed: Jan. 17, 2017

(65) Prior Publication Data

US 2017/0263760 A1    Sep. 14, 2017

Related U.S. Application Data

(60) Provisional application No. 62/305,861, filed on Mar. 9, 2016.

(51) Int. Cl.
*H01L 29/66* (2006.01)
*H01L 29/78* (2006.01)
(Continued)

(52) U.S. Cl.
CPC ...... *H01L 29/7816* (2013.01); *H01L 21/3247* (2013.01); *H01L 29/0607* (2013.01);
(Continued)

(58) Field of Classification Search
CPC .......... H01L 29/7816; H01L 29/66681; H01L 21/3247; H01L 29/1095; H01L 29/0653; H01L 29/0657; H01L 29/0607
(Continued)

(56) References Cited

U.S. PATENT DOCUMENTS

2009/0146206 A1    6/2009   Fukuzumi et al.
2010/0109072 A1    5/2010   Kidoh et al.
(Continued)

FOREIGN PATENT DOCUMENTS

JP    2007158139 A    6/2007
JP    4468433 B2      5/2010
(Continued)

*Primary Examiner* — Mohammad M Hoque
(74) *Attorney, Agent, or Firm* — Kim & Stewart LLP

(57) ABSTRACT

According to one embodiment, a semiconductor device includes a semiconductor device includes a first semiconductor region, a second semiconductor region, a third semiconductor region, an insulating unit, a void, a gate insulating film and a gate electrode. The second semiconductor region provides on a part of the first semiconductor region. The third semiconductor region provides on one other part of the first semiconductor region. The insulating unit provides on a part of the second semiconductor region. The void provides at a lower part of the insulating unit. The gate insulating film provides on a part of the first semiconductor region between the second semiconductor region and the third semiconductor region. The gate electrode provides on the gate insulating film. A position in a first direction of at least a part of the void is between the insulating unit and the third semiconductor region.

11 Claims, 7 Drawing Sheets

(51) Int. Cl.
*H01L 29/06* (2006.01)
*H01L 29/10* (2006.01)
*H01L 21/324* (2006.01)

(52) U.S. Cl.
CPC ...... *H01L 29/0653* (2013.01); *H01L 29/0657* (2013.01); *H01L 29/1095* (2013.01); *H01L 29/66659* (2013.01); *H01L 29/66681* (2013.01); *H01L 29/7835* (2013.01); *H01L 29/0696* (2013.01); *H01L 29/1045* (2013.01)

(58) Field of Classification Search
USPC ....................................................... 257/343
See application file for complete search history.

(56) References Cited

U.S. PATENT DOCUMENTS

| | | |
|---|---|---|
| 2010/0244152 A1 | 9/2010 | Bahl et al. |
| 2011/0049622 A1 | 3/2011 | Kitahara |
| 2012/0003800 A1 | 1/2012 | Lee et al. |
| 2012/0228703 A1* | 9/2012 | Yamaoka .......... H01L 29/66681 257/335 |
| 2012/0327715 A1 | 12/2012 | Lee et al. |
| 2014/0016408 A1 | 1/2014 | Lee et al. |

FOREIGN PATENT DOCUMENTS

| | | |
|---|---|---|
| JP | 2011049394 A | 3/2011 |
| JP | 2012015517 A | 1/2012 |
| JP | 2012522363 A | 9/2012 |
| JP | 5300419 B2 | 9/2013 |

\* cited by examiner

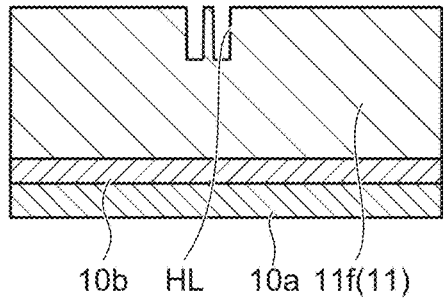
FIG. 3A
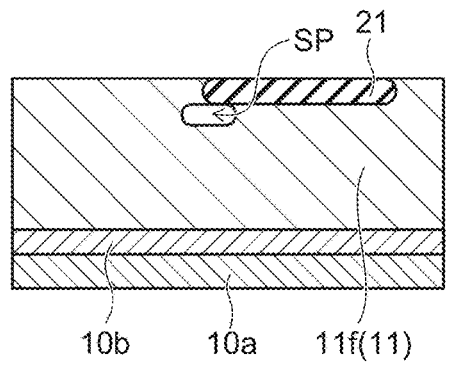
FIG. 3D
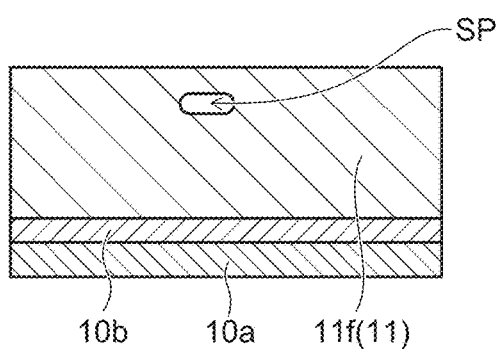
FIG. 3B
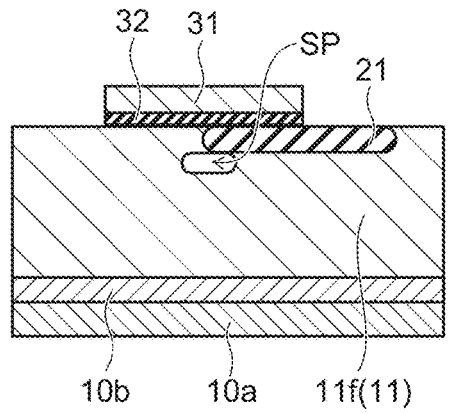
FIG. 3E
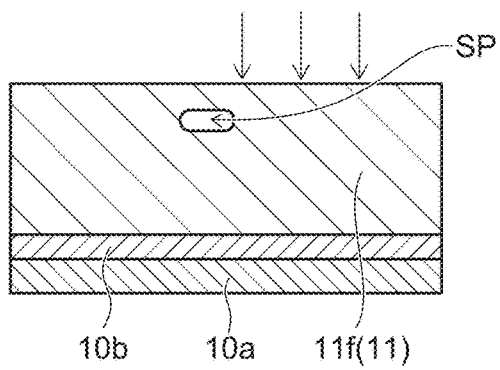
FIG. 3C
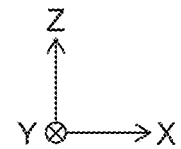

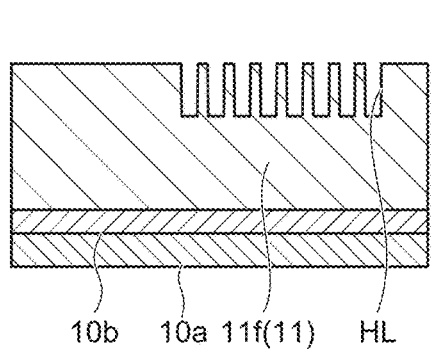
FIG. 4A
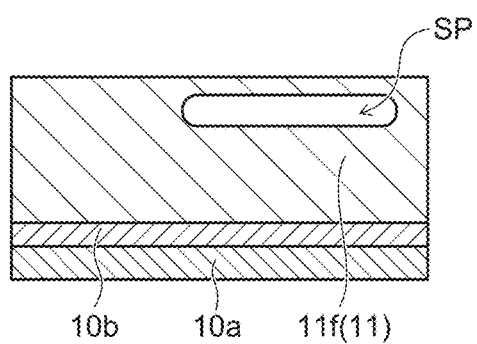
FIG. 4B
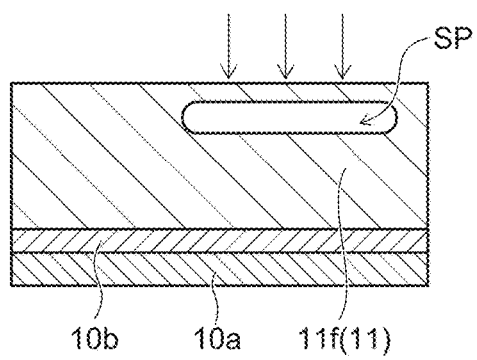
FIG. 4C
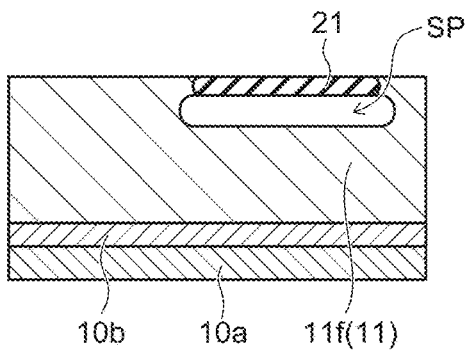
FIG. 4D
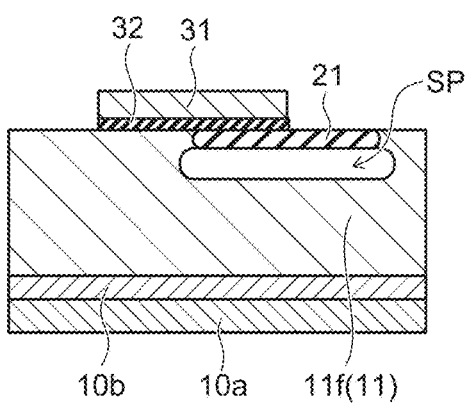
FIG. 4E
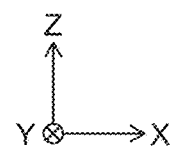

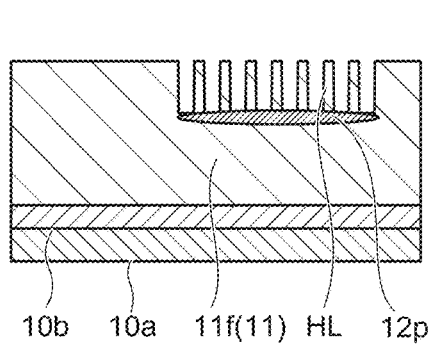
FIG. 5A
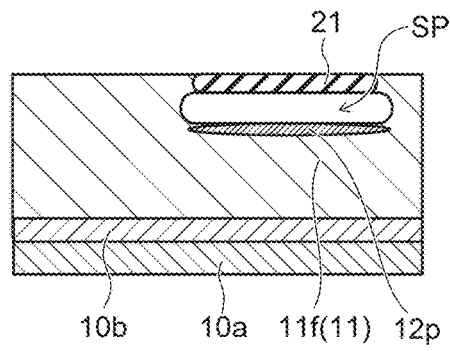
FIG. 5D
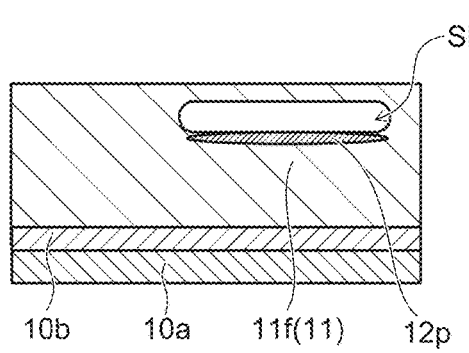
FIG. 5B
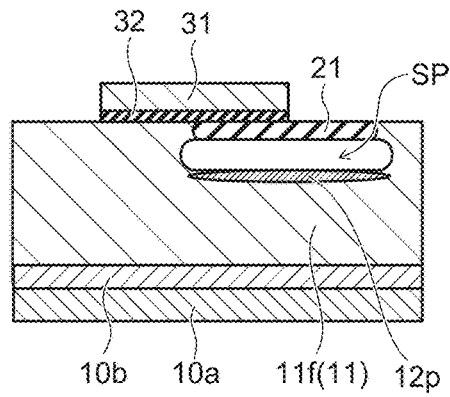
FIG. 5E
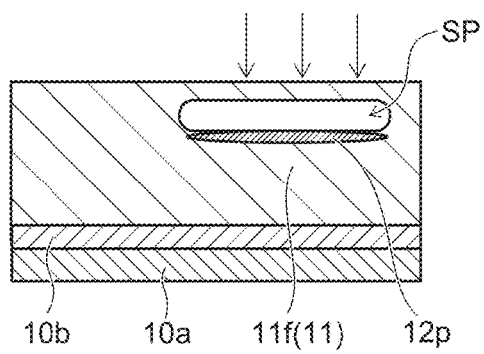
FIG. 5C
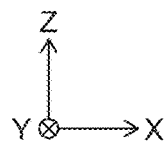

SEMICONDUCTOR DEVICE INCLUDING LATERALLY DIFFUSED METAL-OXIDE-SEMICONDUCTOR FIELD EFFECT TRANSISTOR AND METHOD FOR MANUFACTURING THE SAME

CROSS-REFERENCE TO RELATED APPLICATIONS

This application is based upon and claims the benefit of priority from U.S. Provisional Patent Application 62/305,861, filed on Mar. 9, 2016; the entire contents of which are incorporated herein by reference.

FIELD

Embodiments described herein relate generally to a semiconductor device and a method for manufacturing the same.

BACKGROUND

For example, a LDMOS (laterally diffused metal-oxide-semiconductor field-effect transistor) is one semiconductor device. It is desirable to increase the reliability of the semiconductor device.

BRIEF DESCRIPTION OF THE DRAWINGS

FIG. 3A to FIG. 3E are schematic cross-sectional views in order of the processes, illustrating the method for manufacturing the semiconductor device according to the first embodiment;

FIG. 4A to FIG. 4E are schematic cross-sectional views in order of the processes, illustrating the other method for manufacturing the semiconductor device according to the first embodiment;

FIG. 5A to FIG. 5E are schematic cross-sectional views in order of the processes, illustrating another method for manufacturing the semiconductor device according to the first embodiment;

DETAILED DESCRIPTION

Figure 1:
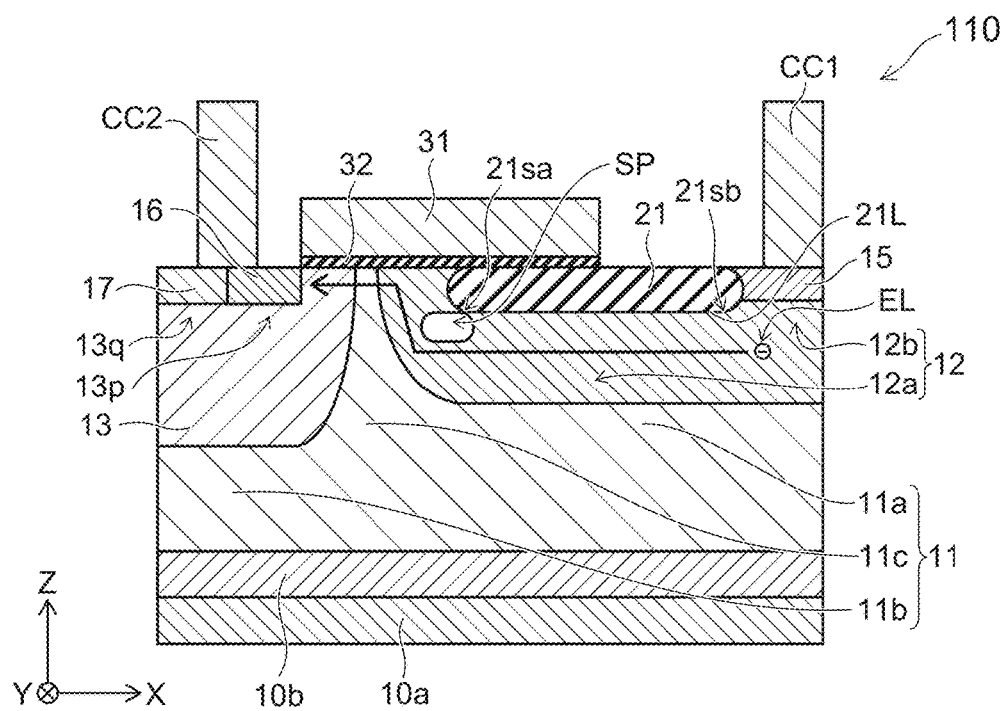
FIG. 1 is a schematic cross-sectional view illustrating a semiconductor device according to a first embodiment.

In general, according to one embodiment, a semiconductor device includes a first semiconductor region of a first conductivity type, a second semiconductor region of a second conductivity type, a third semiconductor region of the first conductivity type, an insulating unit, a void, a gate insulating film and a gate electrode. The second semiconductor region provides on a part of the first semiconductor region. A drain is provided at a part of the second semiconductor region. The third semiconductor region provides on one other part of the first semiconductor region. A source is provided at a part of the third semiconductor region. The insulating unit provides on a part of the second semiconductor region. The void provides at a lower part of the insulating unit. The gate insulating film provides on a part of the first semiconductor region between the second semiconductor region and the third semiconductor region. The gate electrode provides on the gate insulating film. A position in a first direction of at least a part of the void is between the insulating unit and the third semiconductor region. The first direction is from the drain toward the source.

Embodiment of the invention will be described hereinafter with reference to the accompanying drawings.

Note that, the drawings are schematic or conceptual. Relations between thicknesses and widths of portions, ratios of sizes among the portions, and the like are not always the same as real ones. Even when the same portions are shown, the portions are sometimes shown in different dimensions and ratios depending on the drawings. Note that in the specification and the drawings, components described with reference to the drawings already referred to are denoted by the same reference numerals and signs. Detailed description of the components is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first semiconductor region 11, a second semiconductor region 12, a third semiconductor region 13, an insulating unit 21, a gate insulating film 32, and a gate electrode 31.

The first semiconductor region 11 is of a first conductivity type. The second semiconductor region 12 is of a second conductivity type. The third semiconductor region 13 is of the first conductivity type.

The second semiconductor region 12 is provided on a part (a first region 11a) of the first semiconductor region 11. The third semiconductor region 13 is provided on one other part (a second region 11b) of the first semiconductor region 11. The third semiconductor region 13 is separated from the second semiconductor region 12. A part (a third region 11c) of the first semiconductor region 11 is between the second semiconductor region 12 and the third semiconductor region 13.

Although the description hereinbelow uses an example in which the third semiconductor region 13 is separated from the second semiconductor region 12, the third semiconductor region may contact the second semiconductor region 12. In such a case, the third region 11c is a portion including an interface between the third semiconductor region 13 and the second semiconductor region 12.

The insulating unit 21 is provided on a part (a fourth region 12a) of the second semiconductor region 12.

The gate insulating film 32 is provided on the third region 11c (the portion positioned between the second semiconductor region 12 and the third semiconductor region 13) of the first semiconductor region 11. The gate electrode 31 is provided on the gate insulating film 32.

The first semiconductor region 11 is, for example, an epitaxial layer. The second semiconductor region 12 is, for example, a drift layer. The third semiconductor region 13 is, for example, a diffusion layer.

A direction from the first semiconductor region 11 (e.g., the third region 11c) toward the gate electrode 31 is taken as a Z-direction. One direction crossing the Z-direction is taken as an X-direction. A direction crossing the Z-direction and the X-direction is taken as a Y-direction.

A lower end 21L of the insulating unit 21 includes a first end portion 21sa and a first opposite end portion 21sb. The first end portion 21sa is the end portion on the third semiconductor region 13 side. The first opposite end portion 21sb is the end portion on the side opposite to the first end portion 21sa. The first opposite end portion 21sb is arranged with the first end portion 21sa in the X-direction.

A void SP is provided at a part between the insulating unit 21 and the second semiconductor region 12. A part of the void SP is positioned between the first end portion 21sa and the second semiconductor region 12. The void SP contacts the first end portion 21sa. The first end portion 21sa is exposed in the void SP. In the example, the void SP is not provided at a portion of the first opposite end portion 21sb. The first opposite end portion 21sb contacts the second semiconductor region 12.

In the embodiment, a position in the X-direction of at least a part of the void SP is between the position of the insulating unit 21 and a position of a part of the first semiconductor region 11 between the second semiconductor region 12 and the third semiconductor region 13.

In the example, a drain layer 15, a first source layer 16, a back gate layer 17, a first contact plug CC1, and a second contact plug CC2 are further provided in the semiconductor device 110.

The drain layer 15 is provided on one other part (a fifth region 12b) of the second semiconductor region 12. The first source layer 16 is provided on a part (a sixth region 13p) of the third semiconductor region 13. The back gate layer 17 is provided on one other part (a seventh region 13q) of the third semiconductor region 13. The first source layer 16 is provided between the second semiconductor region 12 and the back gate layer 17 in the X-direction.

The first contact plug CC1 is provided on the drain layer 15. The first contact plug CC1 is electrically connected to the drain layer 15. The second contact plug CC2 is provided on the first source layer 16 and on the back gate layer 17. The second contact plug CC2 is electrically connected to the first source layer 16 and the back gate layer 17.

The first conductivity type is, for example, an n-type; and the second conductivity type is a p-type. The conductivity types may be reversed. Hereinbelow, it is taken that the first conductivity type is the n-type, and the second conductivity type is the p-type.

The drain layer 15 is of the second conductivity type (the p-type). The first source layer 16 is of the second conductivity type (the p-type). The back gate layer 17 is of the first conductivity type (the n-type).

The effective impurity concentration of the second semiconductor region 12 is higher than the effective impurity concentration of the first semiconductor region 11. The effective impurity concentration of the second semiconductor region 12 is lower than the effective impurity concentration of the drain layer 15. The effective impurity concentration of the third semiconductor region 13 is higher than the effective impurity concentration of the first semiconductor region 11. The effective impurity concentration of the third semiconductor region 13 is lower than the effective impurity concentration of the first source layer 16. The effective impurity concentration of the third semiconductor region 13 is lower than the effective impurity concentration of the back gate layer 17.

The "effective impurity concentration" corresponds to the concentration of the impurities contributing to the conduction of the semiconductor. In the case where both an impurity that forms acceptors and an impurity that forms donors are included, the conductivity due to a part of the two impurities is canceled. In such a case, the "effective impurity concentration" corresponds to the concentrations of the impurities excluding the canceled portion.

In the semiconductor device 110, a voltage (a gate voltage) is applied to the gate electrode 31. Thereby, an inversion layer is formed in the part (the third region 11c) of the first semiconductor region 11 positioned under the gate electrode 31. Thereby, the semiconductor device 110 is switched to an ON state.

In the semiconductor device 110 in the ON state as shown in FIG. 1, electrons EL move from the second semiconductor region 12 toward the third semiconductor region 13 via an inversion layer (the third region 11c of the first semiconductor region 11). The flow of the electrons EL is controlled by the gate voltage. Switching is performed.

In the case of a reference example in which the void SP is not provided, the electrons EL pass through the vicinity of the first end portion 21sa of the insulating unit 21. The electric field concentrates at the vicinity of the first end portion 21sa. At this time, the electrons EL are injected into the insulating unit 21 at the vicinity of the first end portion 21sa; and there are cases where the electrons EL are trapped. The path (the current path) in which the electrons EL flow changes due to the electrons EL being trapped in the insulating unit 21. For example, the ON resistance undesirably increases due to the change of the current path. In the reference example, there are cases where the characteristics change easily and the reliability is low.

Conversely, in the embodiment, the void SP is provided between the first end portion 21sa and the second semiconductor region 12. For example, the void SP contacts the first end portion 21sa. For example, the electric field concentration at the first end portion 21sa vicinity is suppressed. For example, the trapping of the electrons EL in the insulating unit 21 can be suppressed. The change of the current path is suppressed. For example, the increase of the ON resistance can be suppressed; and the fluctuation of the characteristics can be small. High reliability is obtained.

In the case where the void SP is provided, if the size of the void SP is large, there are cases where the strength of the semiconductor device decreases. In the example according to the embodiment, the void SP is provided at the vicinity of the first end portion 21sa where the electric field concentrates easily; and the void SP is not provided at the other portions. Therefore, in the semiconductor device 110, the increase of the ON resistance can be suppressed while maintaining high strength.

In the semiconductor device 110 in the ON state, for example, the current flows between the first contact plug CC1 and the second contact plug CC2. For example, the electrons EL flow from the first contact plug CC1 toward the second contact plug CC2 via the drain layer 15, the second semiconductor region 12, the inversion layer (the third region 11c of the first semiconductor region 11), the third semiconductor region 13, and the first source layer 16.

In the example (the semiconductor device 110), for example, the first semiconductor region 11 is provided on a semiconductor layer 10b that is provided on a semiconductor substrate 10a. The semiconductor substrate 10a includes, for example, silicon. The semiconductor substrate 10a is, for example, a silicon substrate of the second conductivity type (the p-type). The semiconductor layer 10b is of the first conductivity type (the n-type).

Figure 2:
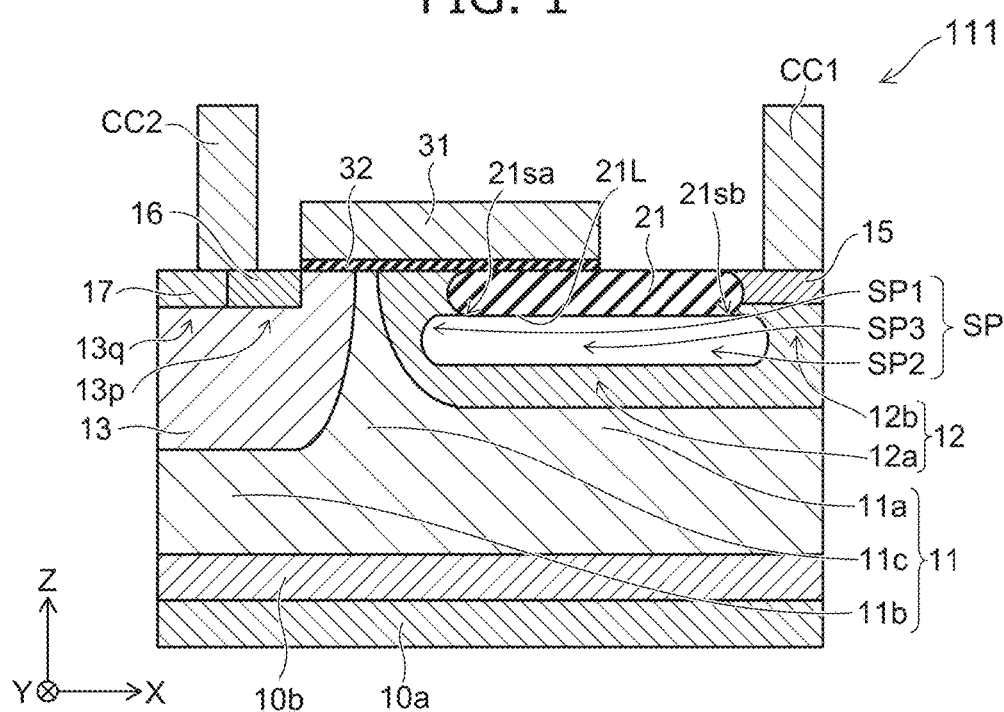
FIG. 2 is a schematic cross-sectional view illustrating another semiconductor device according to the first embodiment.

FIG. 2 is a schematic cross-sectional view illustrating another semiconductor device according to the embodiment.

In the semiconductor device 111 as shown in FIG. 2, the void SP is provided under the first end portion 21sa of the insulating unit 21, under the first opposite end portion 21sb of the insulating unit 21, and under the region between the end portions. Otherwise, the semiconductor device 111 is similar to the semiconductor device 110.

The void SP includes, for example, a first void portion SP1, a second void portion SP2, and a third void portion SP3. The position in the X-direction of the first void portion SP1 is between the position of the insulating unit 21 and the position of the third region 11c (the portion between the second semiconductor region 12 and the third semiconductor region 13) of the first semiconductor region 11. The second void portion SP2 is positioned under a part of the drain layer 15. The third void portion SP3 is positioned between the first void portion SP1 and the second void portion SP2. The third void portion SP3 is positioned under the portion of the insulating unit 21 between the first end portion 21sa and the first opposite end portion 21sb.

The lower end 21L of the insulating unit 21 contacts the void SP. In other words, the lower end 21L is exposed in the void SP. The first end portion 21sa and the first opposite end portion 21sb contact the void SP. The first end portion 21sa and the first opposite end portion 21sb are exposed in the void SP.

In the semiconductor device 111 as well, the increase of the ON resistance can be suppressed; and the fluctuation of the characteristics can be small. High reliability is obtained.

An example of a method for manufacturing the semiconductor device 110 illustrated in FIG. 1 will now be described.

FIG. 3A to FIG. 3E are schematic cross-sectional views in order of the processes, illustrating the method for manufacturing the semiconductor device according to the embodiment.

The semiconductor substrate 10a of the p-type is prepared as shown in FIG. 3A. The semiconductor layer 10b of the n-type is formed on the semiconductor substrate 10a. For example, an impurity (e.g., antimony, etc.) that forms donors is implanted into the upper part of the semiconductor substrate 10a. Thereby, the semiconductor layer 10b is formed.

A first semiconductor film 11f is formed on the semiconductor layer 10b. For example, silicon that includes an impurity that forms donors is epitaxially grown on the semiconductor layer 10b. Thereby, the first semiconductor film 11f is formed. The first semiconductor film 11f becomes the first semiconductor region 11 in a subsequent process.

A hole HL is formed in a part of the first semiconductor film 11f. For example, anisotropic etching such as RIE (Reactive Ion Etching) or the like is performed using a mask. Thereby, the hole HL is formed. For example, the hole HL may be multiply formed in the first semiconductor film 11f. For example, the hole HL has a substantially circular columnar configuration extending in the Z-direction through the first semiconductor film 11f.

Subsequently, heat treatment is performed in a reducing atmosphere. For example, the heat treatment is performed in a hydrogen atmosphere under the condition of a pressure of 10 Torr. The temperature in the heat treatment is, for example, 1100° C. Thereby, as shown in FIG. 3B, migration of the front surface of the first semiconductor film 11f occurs. The configuration of the hole HL changes and becomes the void SP. The void SP is formed inside the first semiconductor film 11f.

As shown in FIG. 3C, oxygen is partially implanted into the portion of the first semiconductor film 11f including the region on the void SP. Thereby, a part of the first semiconductor film 11f is oxidized. As shown in FIG. 3D, the oxidized portion of the first semiconductor film 11f becomes the insulating unit 21.

As shown in FIG. 3E, the gate insulating film 32 is formed on one other part of the first semiconductor film 11f and on a part of the insulating unit 21. The gate electrode 31 is formed on the gate insulating film 32.

As shown in FIG. 1, an impurity (e.g., phosphorus, etc.) that forms donors is ion-implanted into a prescribed region of the first semiconductor film 11f. Thereby, the back gate layer 17 and the third semiconductor region 13 are formed in the prescribed region of the first semiconductor film 11f.

An impurity (e.g., boron, etc.) that forms acceptors is ion-implanted into a prescribed region of the first semiconductor film 11f and a prescribed region of the third semiconductor region 13. Thereby, the drain layer 15 and the second semiconductor region 12 are formed in the prescribed region of the first semiconductor film 11f. The first source layer 16 is formed in the prescribed region of the third semiconductor region 13. The first semiconductor film 11f becomes the first semiconductor region 11.

The void SP is positioned between the insulating unit 21 and the second semiconductor region 12. For example, a part of the insulating unit 21 contacts the void SP. For example, the central portion of the bottom surface of the insulating unit 21 contacts the second semiconductor region 12.

In the manufacturing method of the embodiment, the size of the void SP and the location where the void SP is formed can be controlled. In other words, the hole HL is formed in the portion of the first semiconductor film 11f including the region where the void SP is to be formed. Subsequently, the void SP is formed in the desired portion by heat treatment. Also, the occurrence of defects in the first semiconductor film 11f (the first semiconductor region 11) is suppressed by forming the void SP by the heat treatment.

Another first method for manufacturing the semiconductor device 111 illustrated in FIG. 2 will now be described.

FIG. 4A to FIG. 4E are schematic cross-sectional views in order of the processes, illustrating the other method for manufacturing the semiconductor device according to the embodiment.

The semiconductor substrate 10a of the p-type is prepared as shown in FIG. 4A. The semiconductor layer 10b of the n-type is formed on the semiconductor substrate 10a.

The first semiconductor film 11f is formed on the semiconductor layer 10b. The hole HL is formed in a part of the first semiconductor film 11f. For example, the hole HL may be multiply formed in the first semiconductor film 11f. For example, the hole HL has a substantially circular columnar configuration extending in the Z-direction through the first semiconductor film 11f. For example, the number of the holes HL is set to be more than the number in the process shown in FIG. 3A. The first semiconductor film 11f becomes the first semiconductor region 11 in a subsequent process.

Subsequently, heat treatment is performed in a reducing atmosphere. For example, the heat treatment is performed in a hydrogen atmosphere under the condition of a pressure of 10 Torr. The temperature in the heat treatment is, for example, 1100° C. Thereby, as shown in FIG. 4B, migration of the front surface of the first semiconductor film 11f occurs. The configuration of the hole HL changes and becomes the void SP. The void SP is formed inside the first semiconductor film 11f.

As shown in FIG. 4C, oxygen is partially implanted into the first semiconductor film 11f in the region on the void SP. Thereby, a part of the first semiconductor film 11f is oxidized. As shown in FIG. 4D, the oxidized portion of the first semiconductor film 11f becomes the insulating unit 21.

As shown in FIG. 4E, the gate insulating film 32 is formed on one other part of the first semiconductor film 11f and on a part of the insulating unit 21. The gate electrode 31 is formed on the gate insulating film 32.

As shown in FIG. 2, the first source layer 16, the back gate layer 17, and the third semiconductor region 13 are formed in a prescribed region of the first semiconductor film 11f. The drain layer 15 and the second semiconductor region 12 are formed in another prescribed region of the first semiconductor film 11f. The first semiconductor film 11f becomes the first semiconductor region 11.

The void SP is positioned between the insulating unit 21 and the second semiconductor region 12 in the Z-direction. For example, the bottom surface of the insulating unit 21 contacts the void SP.

In the embodiment, the size of the void SP and the location where the void SP is formed can be controlled. In other words, the hole HL is formed in the portion of the first semiconductor region 11 including the region where the void SP is to be formed. Subsequently, the void SP is formed in the desired portion by heat treatment. The occurrence of defects in the first semiconductor film 11f (the first semiconductor region 11) are suppressed by forming the void SP by heat treatment.

Another second method for manufacturing the semiconductor device 111 will now be described.

FIG. 5A to FIG. 5E are schematic cross-sectional views in order of the processes, illustrating another method for manufacturing the semiconductor device according to the embodiment.

As shown in FIG. 5A, the semiconductor layer 10b is formed on the semiconductor substrate 10a. The semiconductor layer 10b is formed on the semiconductor substrate 10a.

The first semiconductor film 11f is formed on the semiconductor layer 10b. The first semiconductor film 11f becomes the first semiconductor region 11 in a subsequent process.

The hole HL is formed in a part of the first semiconductor film 11f. For example, the hole HL may be multiply formed in the first semiconductor film 11f. For example, the hole HL has a substantially circular columnar configuration extending in the Z-direction through the first semiconductor film 11f.

Subsequently, for example, an impurity that forms acceptors is implanted into the bottom of the hole HL. Thereby, a fourth semiconductor region 12p is formed between the first semiconductor film 11f and the bottom of the hole HL.

Heat treatment is performed in a reducing atmosphere. For example, the heat treatment is performed in a hydrogen atmosphere under the condition of a pressure of 10 Torr. The temperature of the heat treatment is, for example, 1100° C. Thereby, as shown in FIG. 5B, the hole HL becomes the void SP formed inside the first semiconductor film 11f.

As shown in FIG. 5C, oxygen ions are implanted into a part of the first semiconductor film 11f. Thereby, the insulating unit 21 is formed as shown in FIG. 5D. The insulating unit 21 is formed on the void SP.

As shown in FIG. 5E, the gate insulating film 32 is formed on a part of the first semiconductor film 11f and on a part of the insulating unit 21. The gate electrode 31 is formed on the gate insulating film 32.

As shown in FIG. 2, an impurity that forms donors is ion-implanted into a prescribed region of the first semiconductor film 11f. Thereby, the back gate layer 17 and the third semiconductor region 13 are formed in the prescribed region of the first semiconductor film 11f.

An impurity that forms acceptors is ion-implanted into a prescribed region of the first semiconductor film 11f and a prescribed region of the third semiconductor region 13. Thereby, the drain layer 15 and the second semiconductor region 12 are formed in the prescribed region of the first semiconductor film 11f. At this time, the fourth semiconductor region 12p becomes a part (the fourth region 12a) of the second semiconductor region 12. The first source layer 16 is formed in the prescribed region of the third semiconductor region 13. The first semiconductor film 11f becomes the first semiconductor region 11. In the case where the manufacturing is performed using the manufacturing method of the embodiment, the effective impurity concentration of the fourth region 12a is higher than the effective impurity concentration of the other part (the fifth region 12b) of the second semiconductor region 12.

In the manufacturing method, the fourth semiconductor region 12p is preformed in the bottom of the hole HL. Subsequently, the second semiconductor region 12 is formed in the region including the fourth semiconductor region 12p. The fourth semiconductor region 12p becomes a part of the second semiconductor region 12. Thereby, the impurity concentration of the second semiconductor region 12 can be set to be high. The ON resistance can be reduced.

Second Embodiment

Figure 6:
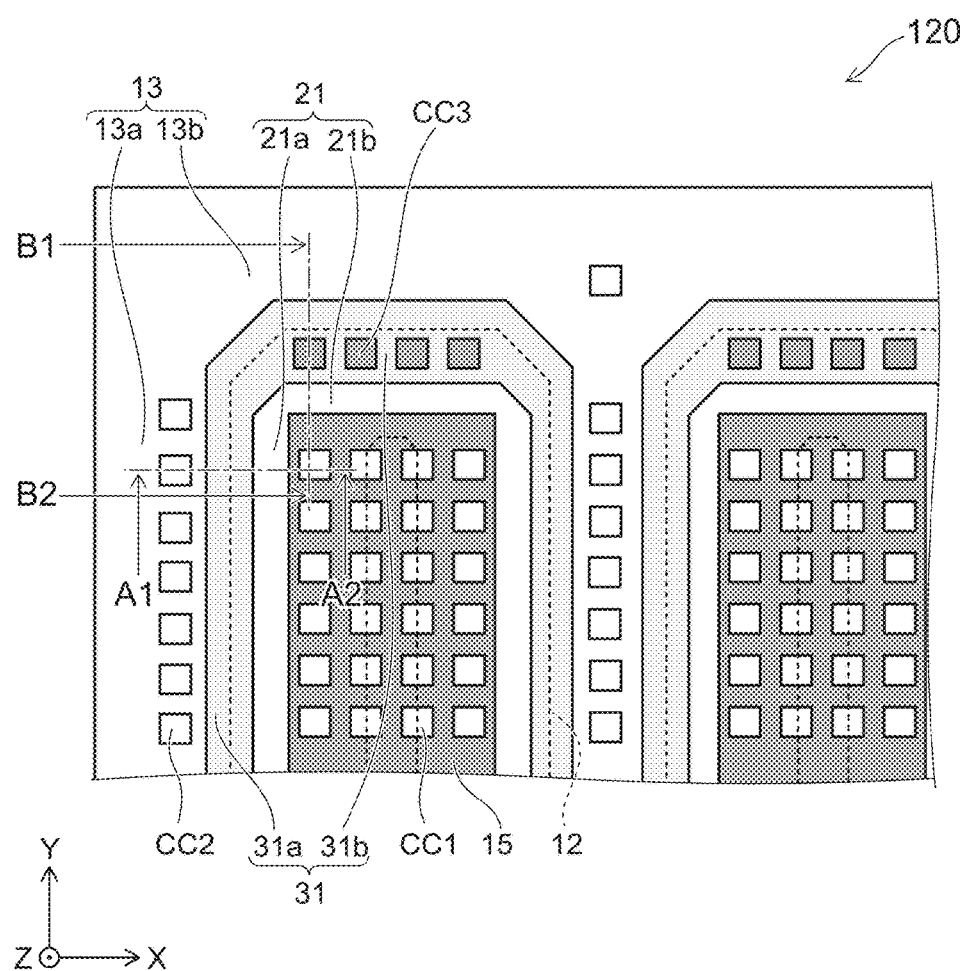
FIG. 6 is a schematic plan view illustrating a semiconductor device according to a second embodiment.

FIG. 6 is a schematic plan view illustrating a semiconductor device according to the embodiment.

Figure 7:
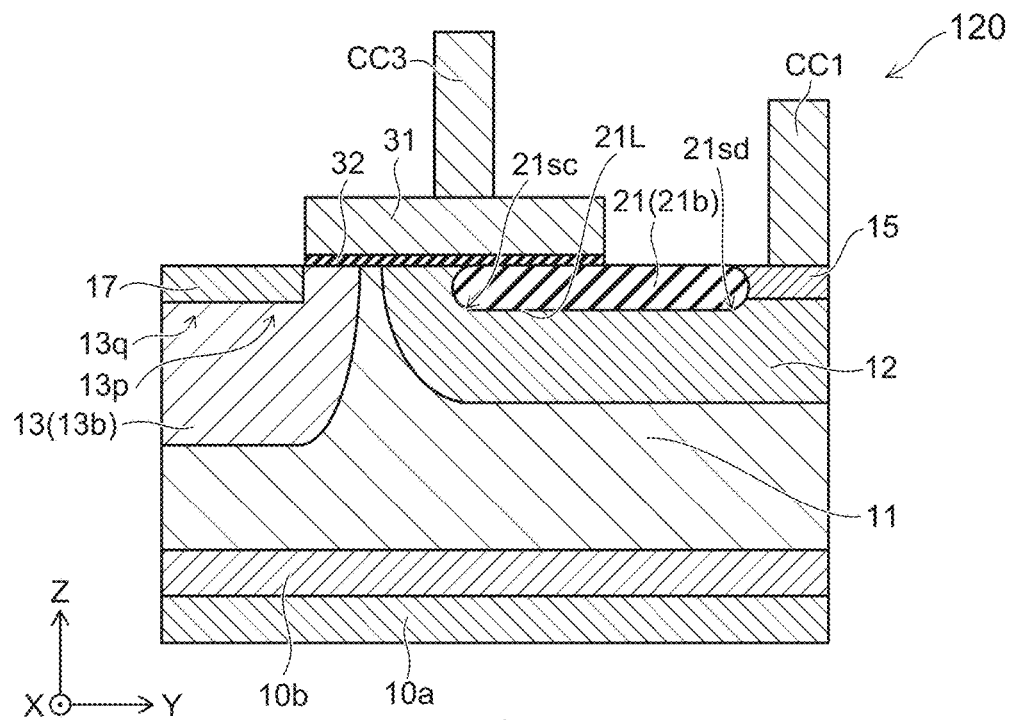
FIG. 7 is a schematic cross-sectional view illustrating the semiconductor device according to the second embodiment.

FIG. 7 is a schematic cross-sectional view illustrating the semiconductor device according to the embodiment.

The cross section along line A1-A2 shown in FIG. 6 corresponds to the cross-sectional view shown in FIG. 2. FIG. 7 is a cross-sectional view illustrating the cross section along line B1-B2 shown in FIG. 6.

As shown in FIG. 6, the insulating unit 21 includes a first insulating region 21a and a second insulating region 21b. The insulating unit 21 is provided to surround the drain layer 15 in the XY plane. The first insulating region 21a is provided along the Y-direction. The second insulating region 21b is provided along the X-direction.

The third semiconductor region 13 includes a first portion 13a and a second portion 13b. The first portion 13a is separated in the X-direction from the insulating unit 21. The second portion 13b is separated in the Y-direction from the insulating unit 21. The third semiconductor region 13 is provided to surround the second semiconductor region 12 in the XY plane. In FIG. 2, the first source layer 16 and the back gate layer 17 are not illustrated to simplify the drawing.

The gate electrode 31 is disposed to surround the drain layer 15 in the XY plane. The gate electrode 31 includes a first electrode portion 31a that extends in the Y-direction, and a second electrode portion 31b that extends in the X-direction. The first electrode portion 31a is provided on the X-direction side of the drain layer 15. The second electrode portion 31b is provided on the Y-direction side of the drain layer 15.

The first contact plug CC1 is provided on the drain layer 15. The first contact plug CC1 is electrically connected to the drain layer 15. The first contact plug CC1 may be multiply provided on the drain layer 15.

The second contact plug CC2 is provided on the first portion 13a of the third semiconductor region 13. The second contact plug CC2 may be multiply provided on the first portion 13a. As shown in FIG. 6, the second contact plug CC2 is electrically connected to the first source layer 16 and the back gate layer 17.

A third contact plug CC3 is provided on the second electrode portion 31b. The third contact plug CC3 is electrically connected to the second electrode portion 31b. The third contact plug CC3 may be multiply provided on the second electrode portion 31b.

As shown in FIG. 2, the void SP is provided between the insulating unit 21 and the second semiconductor region 12 in the Z-direction. The first insulating region 21a of the insulating unit 21 includes the first end portion 21sa and the first opposite end portion 21sb.

The void SP contacts the first end portion 21sa. The void SP may contact the first opposite end portion 21sb. The void SP and at least a part of the first insulating region 21a overlap in the Z-direction.

As shown in FIG. 7, the void SP is not provided between the second insulating region 21b and the second semiconductor region 12. The second insulating region 21b includes a second end portion 21sc and a second opposite end portion 21sd.

The second end portion 21sc contacts the second semiconductor region 12. The second opposite end portion 21sd contacts the second semiconductor region 12.

As shown in FIG. 7, the void is not provided between the second insulating region 21b and the second semiconductor region 12. In the semiconductor device 120, the second semiconductor region 12 at the periphery of the second insulating region 21b substantially is not a current path. Accordingly, in this portion, a change of the current path caused by a void not being provided does not occur easily. By not providing the void between the second insulating region 21b and the second semiconductor region 12, for example, collapse of the insulating unit 21 is suppressed. Accordingly, the strength of the semiconductor device 120 increases. The increase of the ON resistance can be suppressed while maintaining the strength of the semiconductor device 120.

The semiconductor device 120 is manufactured by processes similar to those of the method for manufacturing the semiconductor device 110 according to the first embodiment described above. In the embodiment, by controlling the region where the hole HL is formed, the location where the void SP is formed and the location where the void SP is not formed can be designated.

Third Embodiment

Figure 8:
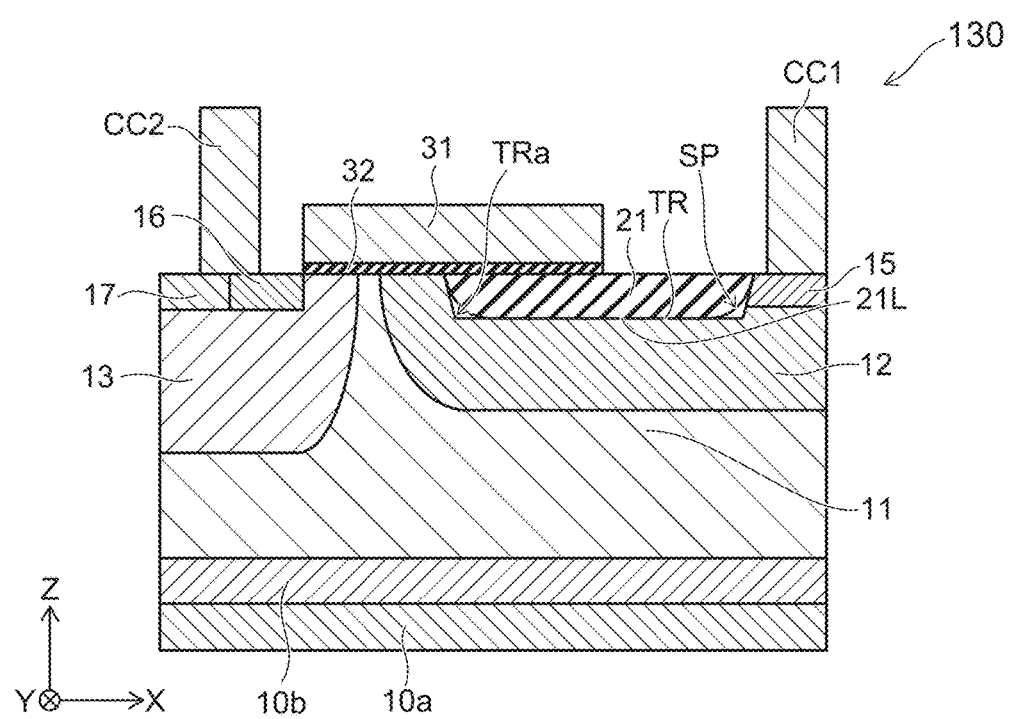
FIG. 8 is a schematic cross-sectional view illustrating a semiconductor device according to a third embodiment.

FIG. 8 is a schematic cross-sectional view illustrating a semiconductor device according to a third embodiment.

In the semiconductor device 130 according to the embodiment as shown in FIG. 8, a trench TR is formed in the upper portion of the second semiconductor region 12. The insulating unit 21 is provided inside the trench TR. The insulating unit 21 is positioned between the drain layer 15 and the second semiconductor region 12 in the X-direction. The void SP is formed in a region of a part between the insulating unit 21 and the second semiconductor region 12.

A part of the void SP is formed at a portion of the trench TR including a corner TRa formed of the side surface and bottom surface of the trench TR. The central portion in the X-direction of the bottom surface of the insulating unit 21 and the second semiconductor region 12 are in contact.

In the embodiment, the void SP exists between the corner TRa and the insulating unit 21. Thereby, trapping of electrons in the insulating unit 21 is suppressed. The change of the current path caused by the electrons being trapped in the insulating unit 21 is suppressed. The increase of the ON resistance is suppressed. Accordingly, the reliability of the semiconductor device 130 increases.

A method for manufacturing the semiconductor device 130 according to the embodiment will now be described.

FIG. 9A to FIG. 9D are schematic cross-sectional views in order of the processes, illustrating the method for manufacturing the semiconductor device according to the embodiment.

Figure 9A:
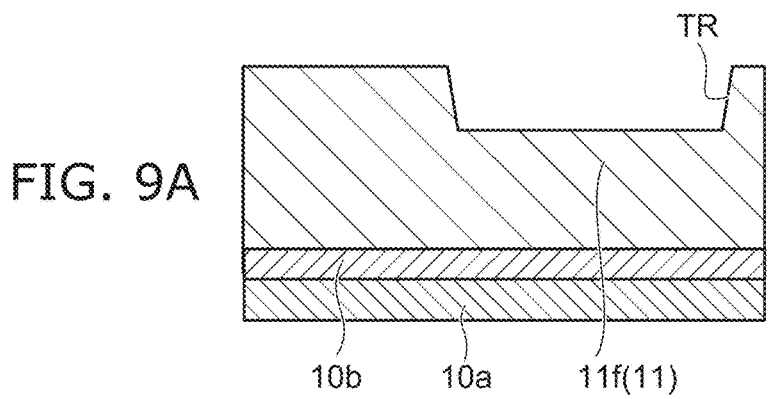
FIG. 9A to FIG. 9D are schematic cross-sectional views in order of the processes, illustrating the method for manufacturing the semiconductor device according to the third embodiment.

The semiconductor substrate 10a is prepared as shown in FIG. 9A. The conductivity type of the semiconductor substrate 10a is, for example, the p-type. The semiconductor layer 10b is formed on the semiconductor substrate 10a.

The first semiconductor film 11f is formed on the semiconductor layer 10b. The first semiconductor film 11f becomes the first semiconductor region 11 in a subsequent process. For example, silicon that includes an impurity that forms donors is epitaxially grown on the semiconductor layer 10b. Thereby, the first semiconductor film 11f is formed. The trench TR is formed in a region of a part of the first semiconductor region 11.

Figure 9B:
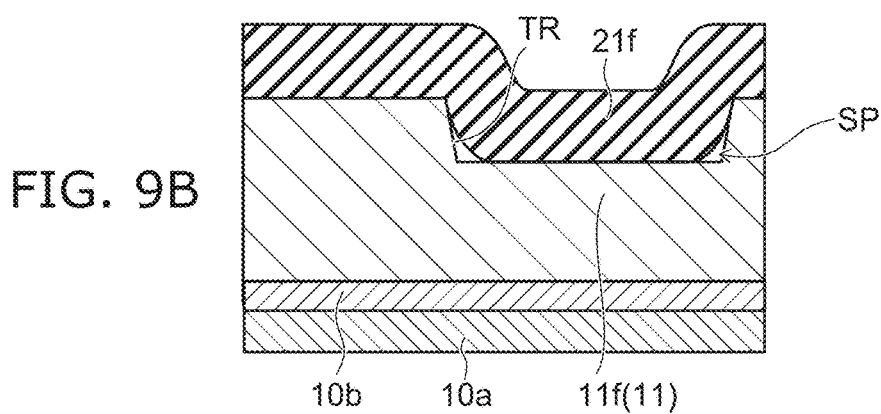
Figure 9C:
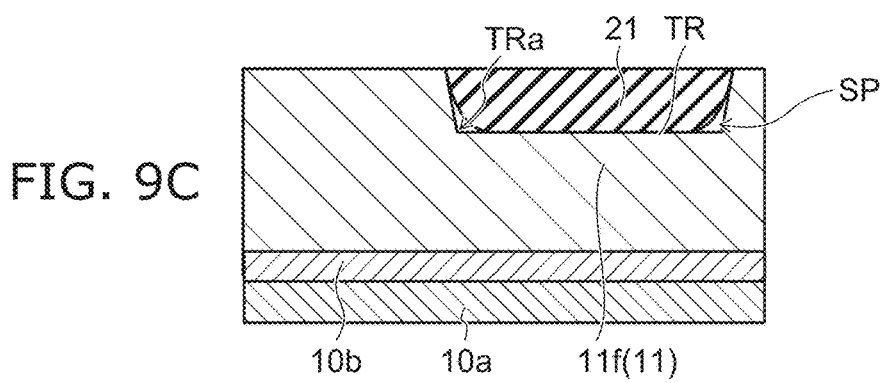

As shown in FIG. 9B, an insulating film 21f is formed inside the trench TR at conditions that provide poor coverage. The corner TRa vicinity of the bottom of the trench TR is not filled with the insulating film 21f. Thereby, the void SP is formed in the region including the corner TRa of the bottom of the trench TR. Subsequently, CMP (chemical mechanical polishing) is performed. At this time, a part of the insulating film 21f remains inside the trench TR. As shown in FIG. 9C, the insulating film 21f that is inside the trench TR becomes the insulating unit 21.

Figure 9D:
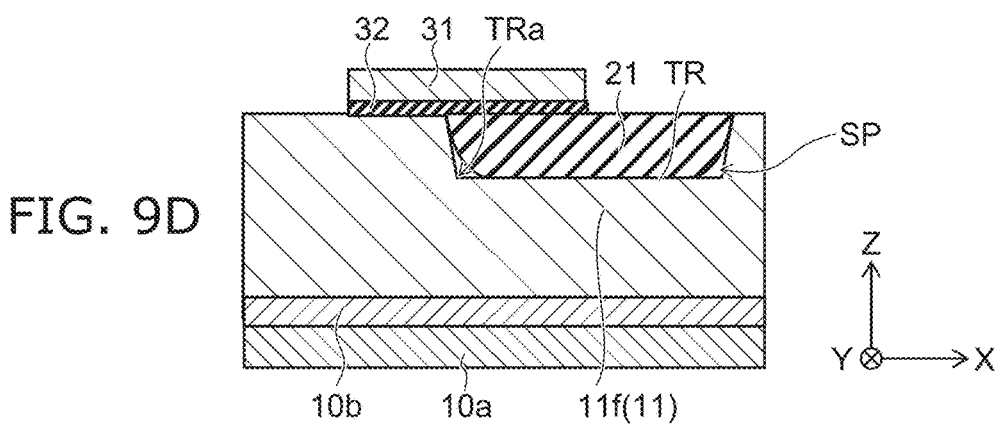

As shown in FIG. 9D, the gate insulating film 32 is formed on a part of the first semiconductor film 11f and on a part on the insulating unit 21. The gate electrode 31 is formed on the gate insulating film 32.

Subsequently, as shown in FIG. 8, the drain layer 15 and the second semiconductor region 12 are formed in a region of a part of the first semiconductor film 11f. The first source layer 16, the back gate layer 17, and the third semiconductor region 13 are formed in a region of one other part of the first semiconductor region 11. The first semiconductor film 11f becomes the first semiconductor region 11.

The semiconductor device 130 according to the embodiment is manufactured by the processes recited above.

In these manufacturing processes, the insulating unit 21 is formed inside the trench TR at conditions that provide poor coverage. Thereby, the void SP is formed between the trench TR and the insulating unit 21. The void SP can be formed between the trench TR and the insulating unit 21 without increasing the manufacturing processes for forming the void SP.

According to the embodiments described above, a highly reliable semiconductor device and a method for manufacturing the semiconductor device can be realized.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first semiconductor region of a first conductivity type;
    a second semiconductor region of a second conductivity type provided on a first part of the first semiconductor region, a drain being provided on a first part of the second semiconductor region;
    a third semiconductor region of the first conductivity type provided on a second part of the first semiconductor region, a source being provided on a part of the third semiconductor region, the drain and the source being spaced from each other in a first direction;
    an insulating unit provided on a second part of the second semiconductor region adjacent to the first part of the second semiconductor region;
    a void provided at a position lower in a second direction crossing the first direction than a lowest portion of the insulating unit in the second direction;
    a gate insulating film provided on a third part of the first semiconductor region between the second semiconductor region and the third semiconductor region in the first direction; and
    a gate electrode provided on the gate insulating film, wherein
    a position along the first direction for at least a part of the void is between an edge position of the insulating unit under the gate electrode in the second direction and an edge position of the third semiconductor region along the first direction, and
    a central part of the insulating unit along the first direction between a first end portion and a second end portion is in direct contact with the second semiconductor region.

2. The semiconductor device according to claim 1, wherein a first end portion of the insulating unit along the first direction contacts the void and the first end portion of the insulating unit is under the gate electrode in the second direction.

3. The semiconductor device according to claim 2, wherein a second end portion of the insulating unit along the first direction opposite to the first end portion contacts the second semiconductor region.

4. The semiconductor device according to claim 2, wherein a second end portion of the insulating unit along the first direction opposite to the first end portion is adjacent to the void in the second direction.

5. The semiconductor device according to claim 1, wherein a part of the void is between the central part of the insulating unit and the second semiconductor region in the second direction.

6. The semiconductor device according to claim 1, wherein an impurity concentration of a part of the second semiconductor region at a lower part of the void is higher than an impurity concentration of another part of the second semiconductor region.

7. A semiconductor device, comprising:
    a first semiconductor region of a first conductivity type;
    a second semiconductor region of a second conductivity type provided on a first part of the first semiconductor region, a drain being provided on a first part of the second semiconductor region;
    a third semiconductor region provided on a second part of the first semiconductor region, a source being provided on a part of the third semiconductor region, the source and the drain being spaced from each other in a first direction;
    an insulating unit provided on a second part of the second semiconductor region that is adjacent to the first part of the second semiconductor region;
    a gate insulating film provided on a third part of the first semiconductor region between the second semiconductor region and the third semiconductor region in the first direction; and
    a gate electrode provided above the gate insulating film in a second direction, wherein
    the insulating unit has a first end portion below the gate electrode in the second direction and a second end portion on a drain end side of the insulating unit in the first direction, the first end portion contacts a void provided between the insulating unit and the second semiconductor region in the second direction, the void being lower than a bottommost portion of the insulating unit in the second direction, the bottom being a lowest portion of the insulating unit, and
    a lower surface of the insulating unit at the second end portion directly contacts the second semiconductor region.

8. The semiconductor device according to claim 7, wherein a lower surface of the insulating unit at the second end portion directly contacts the void.

9. A semiconductor device, comprising:
    a first semiconductor region of a first conductivity type;
    a second semiconductor region of a second conductivity type provided on a first part of the first semiconductor region, a drain being provided on a first part of the second semiconductor region;
    a third semiconductor region provided on a second part of the first semiconductor region, a source being provided on a part of the third semiconductor region, the source and the drain being spaced from each other in a first direction;
    an insulating unit provided on a second part of the second semiconductor region that is adjacent to the first part of the second semiconductor region;
    a gate insulating film provided on a third part of the first semiconductor region between the second semiconductor region and the third semiconductor region in the first direction; and a gate electrode provided above the gate insulating film in a second direction, wherein the insulating unit has a first end portion below the gate electrode in the second direction and a second end portion on a drain end side of the insulating unit in the first direction, the first end portion contacts a void provided between the insulating unit and the second semiconductor region in the second direction, the void being lower than a bottommost portion of the insulating unit in the second direction, the bottom being a lowest portion of the insulating unit, and a central portion of the insulating unit between the first and second end portions in the second direction directly contacts the second semiconductor region.

10. The semiconductor device according to claim 7, wherein a part of the void is located between the second semiconductor region and the central portion of the insulating unit that is between the first and second end portions in the second direction.

11. The semiconductor device according to claim 7, wherein an impurity concentration of a part of the second semiconductor region at a lower part of the void is higher than an impurity concentration of another part of the second semiconductor region.

* * * * *